(12) United States Patent
Chu et al.

(10) Patent No.: US 11,398,524 B2
(45) Date of Patent: Jul. 26, 2022

(54) CHIP-ON-BOARD TYPE PHOTOELECTRIC DEVICE

(71) Applicant: KAISTAR Lighting (Xiamen) Co., Ltd., Xiamen (CN)

(72) Inventors: Chen Chu, Xiamen (CN); Gang Wang, Xiamen (CN)

(73) Assignee: KAISTAR LIGHTING (XIAMEN) CO., LTD., Xiamen (CN)

(*) Notice: Subject to any disclaimer, the term of this patent is extended or adjusted under 35 U.S.C. 154(b) by 0 days.

(21) Appl. No.: 17/492,634

(22) Filed: Oct. 3, 2021

(65) Prior Publication Data

US 2022/0130897 A1   Apr. 28, 2022

(30) Foreign Application Priority Data

Oct. 23, 2020 (CN) .......................... 202011147797.X

(51) Int. Cl.
| | |
|---|---|
| *H01L 27/15* | (2006.01) |
| *H05B 45/28* | (2020.01) |
| *F21K 9/20* | (2016.01) |
| *H05B 45/20* | (2020.01) |
| *H01L 25/075* | (2006.01) |
| *H05B 45/48* | (2020.01) |
| *F21Y 115/10* | (2016.01) |

(52) U.S. Cl.
CPC .............. *H01L 27/156* (2013.01); *F21K 9/20* (2016.08); *H01L 25/0753* (2013.01); *H05B 45/20* (2020.01); *H05B 45/28* (2020.01); *H05B 45/48* (2020.01); *F21Y 2115/10* (2016.08)

(58) Field of Classification Search
CPC ..... H01L 27/156; H01L 25/0753; F21K 9/20; H05B 45/20; H05B 45/28; H05B 45/48
See application file for complete search history.

(56) References Cited

U.S. PATENT DOCUMENTS

| | | | |
|---|---|---|---|
| 8,624,271 B2 * | 1/2014 | Reiherzer | ........... H01L 25/0753 438/26 |
| 10,074,635 B2 * | 9/2018 | Tiwari | ............... H01L 25/0753 |
| 10,192,854 B2 * | 1/2019 | Welch | .................... H01L 33/60 |

(Continued)

*Primary Examiner* — Rajarshi Chakraborty
*Assistant Examiner* — Michael Chiang
(74) *Attorney, Agent, or Firm* — Hemisphere Law, PLLC; Zhigang Ma

(57) ABSTRACT

A chip-on-board type photoelectric device exemplarily includes: a package substrate, provided with a chip mounting region, a first electrode and a second electrode, the first and second electrodes being arranged spaced from each other at a periphery of the chip mounting region; first photoelectric chips, arranged in the chip mounting region to form inwardly concave strip-shaped patterns as mutually spaced first color temperature regions, and electrically connected between the first and second electrodes to form at least one first photoelectric chip string; and second photoelectric chips, arranged in the chip mounting region to form second color temperature regions. A light-emitting color temperature of each the second color temperature region is higher than that of each the first color temperature region. The second photoelectric chips are electrically connected between the first and second electrodes to form second photoelectric chip strings. A good uniformity of light mixing can be achieved.

18 Claims, 7 Drawing Sheets

(56) References Cited

U.S. PATENT DOCUMENTS

| | | | |
|---|---|---|---|
| 2014/0232288 A1* | 8/2014 | Brandes | F21K 9/232 |
| | | | 315/250 |
| 2016/0113080 A1* | 4/2016 | Hsing Chen | H05B 45/10 |
| | | | 315/210 |
| 2018/0286841 A1* | 10/2018 | Makanoeich | H05B 45/46 |
| 2019/0239308 A1* | 8/2019 | Lee | H01L 25/167 |
| 2021/0105873 A1* | 4/2021 | Francis | H05B 45/20 |

\* cited by examiner

CHIP-ON-BOARD TYPE PHOTOELECTRIC DEVICE

TECHNICAL FIELD

The disclosure relates to the field of photoelectric technology, and particularly to a chip-on-board (COB) type photoelectric device.

DESCRIPTION OF RELATED ART

A COB type dimming product includes two groups of light-emitting diodes being respectively for two different color temperature channels and integrated in a same COB type photoelectric device, in which the purpose of adjustment of a color temperature/brightness can be achieved through adjusting an input current to change light-emitting intensities of the two groups of light-emitting diodes.

For an existing COB type dimming product, the two color temperature channels are achieved by chip scale package (CSP) light emitting diodes with flip chips, or one of the two color temperature channels is achieved by CSP light emitting diodes with flip chips and the other of the two color temperature channels is achieved by flip chips and a phosphor glue coating/layer. An advantage of this type of COB type dimming product is that a surface of each of the flip chips does not require wire bonding, and positions of the flip chips for different color temperature channels may be set more flexibly.

For another existing COB type dimming product, a structure including a mirror aluminum substrate, lateral chips and phosphor glue coatings is adopted/used. Compared with the above described structure of using the flip-chips, this type of structure is used in more and more dimming products, due to a higher optical efficiency and a low cost of the normal chips as well as a relatively higher reflectivity of the mirror aluminum substrate. However, only in case that the normal chips for a same color temperature channel in the dimming product are connected in series via wire bonding to form a chip string, the series-connected normal chips can be driven at the same time, and therefore, respective chips of the same chip string must be arranged adjacent to each other and do not cross with another chip string to thereby ensure that wires of different chip strings do not cross over. This design requirement results in that a chip string for one color temperature channel in the dimming product cannot cross with a chip string for another color temperature channel, which makes it difficult to form a complex arrangement of different color temperature channels being unevenly and alternately mixed. However, if chips for a certain color temperature channel are arranged too concentrated, it will inevitably lead to uneven light mixing effect, which is more prominent in DW (also referred to as Dim-to-Warm, or Warm Dimming) dimming products.

Further, the DW dimming products are characterized by simulating a lighting state of a traditional incandescent lamp, that is, a low color temperature and a low brightness (typically, the color temperature is 1800 Kelvins (K), and the brightness is smaller than 5%) are achieved when a small current is inputted, and a high color temperature (usually a color temperature of 2700K or 3000K) and a high brightness are obtained when a large current is inputted. In order to realize the above dimming and toning functions, compared with other types of dimming products, the DW dimming products have following several differences in design: (1) chip strings are required to be connected in parallel in designing a corresponding circuit, but one or more of the chip strings would have a lower voltage than that of the other of the chip strings connected in parallel therewith when a small current is inputted; (2) a phosphor glue is individually coated onto a chip string(s) with a low voltage when a small current is inputted, to enable the coated chip string(s) to reach a required low color temperature; and (3) the number of the chip string(s) for a low color temperature should not be too many, since it will reduce an overall light-emitting efficiency of the product. Because a chip number of the chip string(s) for a low color temperature is far less than that of the chip strings for a high color temperature, as shown in FIG. 1, a general DW dimming product adopts a straight strip region located on a center line of a COB type photoelectric device as a low color temperature region, and has one chip string for the low color temperature and three chip strings for the high color temperature. In particular, the chip string for the low color temperature includes ten chips 13 connected in series, and the three chip strings for the high color temperature respectively include eleven chips 15 connected in series, twelve chips 15 connected in series, and twelve chips 15 connected in series. A circuit connection of this design is simple and intuitive, and different color temperature regions have central symmetry. A far-field distribution uniformity can be accepted by most users if no external optical lens is used for confining a light-emitting angle. However, for more applications of DW dimming products, it is required to use an external optical lens to achieve a specific light-emitting angle, a design of chips for low color temperature being arranged centrally on a center line combined with the use of optical lens can easily highlight the problem of uneven color mixing. Therefore, how to solve the uneven color mixing of the DW dimming product used with the external optical lens is an urgent technical problem to be solved.

SUMMARY

Therefore, an embodiment of the disclosure provides a chip-on-board type photoelectric device, which can realize a better light mixing uniformity.

Specifically, an embodiment of the disclosure provides a COB typed photoelectric device, which includes: a package substrate, provided with a chip mounting region, a first electrode and a second electrode, where the first electrode and the second electrode are arranged spaced from each other at a periphery of the chip mounting region; multiple first photoelectric chips, arranged in the chip mounting region to form multiple inwardly concave strip-shaped patterns as multiple first color temperature regions, where the multiple inwardly concave strip-shaped patterns are spaced from each other, some of the multiple first photoelectric chips arranged in each of the multiple first color temperature regions are connected in series, the multiple first photoelectric chips are electrically connected between the first electrode and the second electrode to form at least one first photoelectric chip string, and each of the at least one first photoelectric chip string includes some of the multiple first photoelectric chips connected in series; and multiple second photoelectric chips, arranged in the chip mounting region to form multiple second color temperature regions, where the multiple second color temperature regions are separated by the multiple first color temperature regions in the chip mounting region, a light-emitting color temperature of each of the multiple second color temperature regions is higher than that of each of the multiple first color temperature regions, the multiple second photoelectric chips are electrically connected between the first electrode and the second electrode to form multiple second photoelectric chip strings, and each of the multiple second photoelectric chip strings includes some of the multiple second photoelectric chips connected in series.

In an embodiment of the disclosure, the multiple first photoelectric chips arranged in each of the multiple first color temperature regions are sequentially arranged starting from opposite ends of the first color temperature region and toward a middle of the first color temperature region in a manner of gradually approaching a center of the chip mounting region, and the opposite ends are individually adjacent to a boundary of the chip mounting region; and, the multiple second color temperature regions include: at least one region located between the multiple first color temperature regions, and regions each located at a side of each of the multiple first color temperature regions facing away from the center.

In an embodiment of the disclosure, each of the multiple inwardly concave strip-shaped patterns is an arc-shaped pattern.

In an embodiment of the disclosure, each of the multiple inwardly concave strip-shaped patterns is a fold-line pattern.

In an embodiment of the disclosure, the multiple first color temperature regions respectively include the same number or different numbers of the first photoelectric chips.

In an embodiment of the disclosure, a number ratio of the at least one first photoelectric chip string to the multiple second photoelectric chip strings is in a range of 1:2-1:7, and the number of the multiple second photoelectric chip strings is greater than or equal to 3.

In an embodiment of the disclosure, each of the at least one first photoelectric chip string and a resistor arranged on the package substrate are connected in series between the first electrode and the second electrode.

In an embodiment of the disclosure, the number of the multiple first photoelectric chips of each of the at least one first photoelectric chip string is smaller than the number of the multiple second photoelectric chips of each of the multiple second photoelectric chip strings.

In an embodiment of the disclosure, within five imaginary blocks of equal areas divided in the chip mounting region, a ratio of a light-emitting area of the first photoelectric chips in each of the five imaginary blocks to a total light-emitting area of the multiple first photoelectric chips in the chip mounting region is in a range of 15%-25%, and the five imaginary blocks include a central block and quartered blocks of an annular region enclosed by a boundary of the central block and a boundary of the chip mounting region.

In an embodiment of the disclosure, the multiple first photoelectric chips and the multiple second photoelectric chips are lateral light emitting diode (LED) chips.

The above technical solutions can have one or more of advantages as follows: for the chip-on-board type photoelectric device according to any one of the embodiments of the disclosure, the multiple first photoelectric chips are reasonably laid out in the chip mounting region to form multiple inwardly concave strip-shaped (also referred to as band-shaped) patterns as multiple first color temperature regions. As such, an inwardly concave shape of each of the first color temperature regions can ensure that a certain number of first photoelectric chips extend into a central region of the light emitting surface (or a central region of the chip mounting region), which can make light colors of a light spot outputted from the chip-on-board type photoelectric device in various directions can tend to be uniform. Furthermore, since the opposite ends of each of the first color temperature regions are adjacent to the boundary of the chip mounting region, it is convenient/beneficial for the first photoelectric chips to form electrical connections with the first electrode as well as the second electrode.

BRIEF DESCRIPTION OF THE DRAWINGS

In order to explain technical solutions of embodiments of the disclosure or the related art more clearly, accompanying drawings used in the description of the embodiments or the related art will be briefly introduced below. It is apparent that the accompanying drawings in the following description are some of embodiments of the disclosure, and other drawings can be also obtained according to these accompanying drawings without creative effort for the ordinary technicians in the field.

DETAILED DESCRIPTION OF EMBODIMENTS

The specific structures and functional details disclosed herein are merely representative and intended to describe exemplary embodiments of the disclosure. However, the disclosure can be embodied in many alternative forms, and should not be interpreted/construed as being limited only to the embodiments set forth herein.

In the description of the disclosure, it should be noted that orientations or position relationships indicated by terms "center", "lateral", "above", "below", "left", "right", "vertical", "horizontal", "top", "bottom", "inner" and "outer" are based on orientation or position relationships shown in the accompanying drawings, which are merely intended to briefly describe the disclosure and simplifying the description, rather than indicating or implying that a corresponding device or element referred to must have a specific orientation and must be constructed and operated in the specific orientation, and thus the orientations or position relationships should not be understood as limitations of the disclosure. In addition, terms "first" and "second" are merely used for descriptive purposes, and cannot be understood as indicating or implying relative importance or implicitly indicating the number of indicated technical features. Therefore, a feature defined with the terms "first" and "second" may include one or more the features explicitly or implicitly. In the description of the disclosure, unless otherwise specified, a term "multiple/plurality" means two or more. In addition, the term "include" and any variations thereof are intended to cover non-exclusive inclusion.

In the description of the disclosure, it should be noted that unless otherwise specified and limited, terms "installing", "connecting" and "coupling" should be understood in a broad sense, for example, which can be understood as fixed connection, detachable connection or integrated connection; mechanical connection or electrical connection; or, direct connection, indirectly connection through an intermediate medium or internal communication of two elements. For the ordinary technicians in the field, the specific meanings of the above terms in the disclosure can be understood according to specific situations.

The terminology used herein is merely used for describing specific embodiments and is not intended to limit exemplary embodiments. Singular forms "a" and "an" used herein are also intended to include the plural, unless the context clearly requires otherwise. It should also be understood that the terms "contain" and/or "include" used herein specify the presence of stated features, integers, steps, operations, units and/or components, but do not exclude the presence or addition of one or more other features, integers, steps, operations, units, components and/or combinations thereof.

First Embodiment

Figure 2:
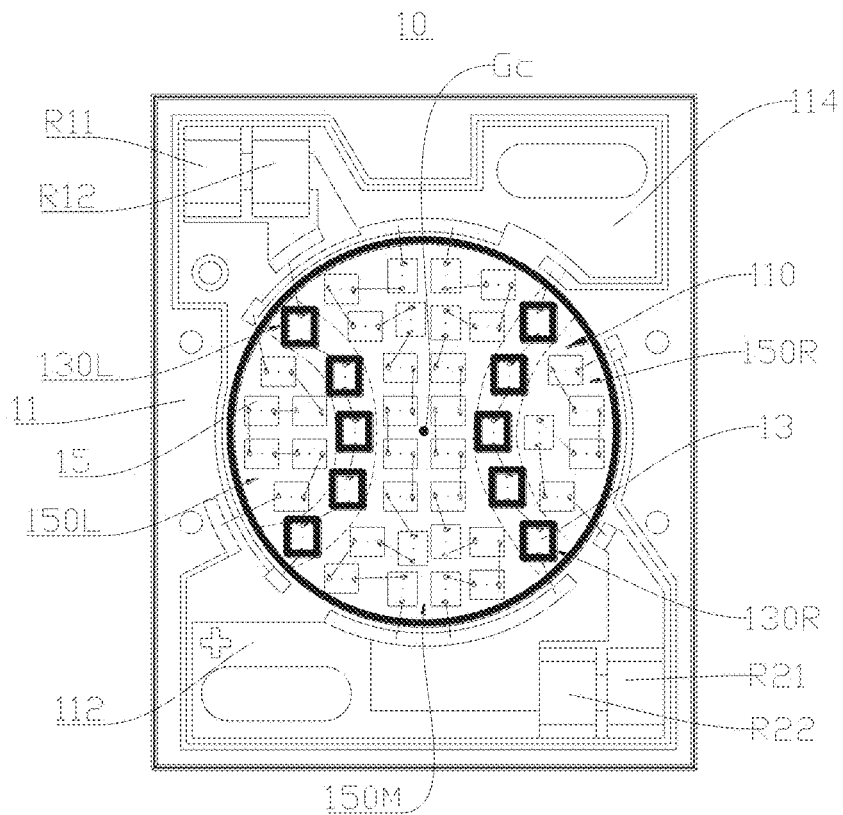
FIG. 2 is a schematic structural diagram of a chip-on-board type photoelectric device according to a first embodiment of the disclosure.
Figure 3:
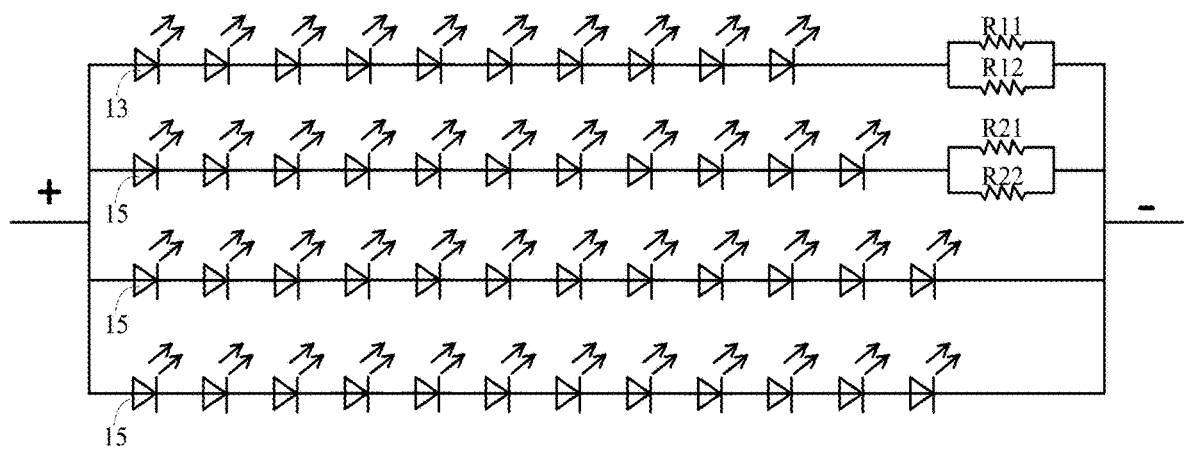
FIG. 3 is an equivalent circuit diagram of the chip-on-board type photoelectric device shown in FIG. 2.

Referring to FIGS. 2 and 3, a chip-on-board type photoelectric device 10 is provided according to a first embodiment of the disclosure. The chip-on-board type photoelectric device 10 for example includes a package substrate 11, multiple first photoelectric chips 13 and multiple second photoelectric chips 15.

Specifically, the package substrate 11 is provided with a chip mounting region 110, a first electrode 112 and a second electrode 114. The first electrode 112 and the second electrode 114 are arranged spaced from each other at a periphery of the chip mounting region 110. For example, the package substrate 11 may be a mirror aluminum substrate, the chip mounting region 110 may be a circular region surrounded by a dam glue (e.g., the KER2020 opalescent silica gel sold on the market), and the first electrode 112 and the second electrode 114 may be respectively a positive electrode (+) and a negative electrode (−), which are not limited thereto in the embodiment of the disclosure.

The multiple first photoelectric chips 13 are arranged in the chip mounting region 110 to form two inwardly concave strip-shaped patterns as two first color temperature regions 130L and 130R. The two inwardly concave strip-shaped patterns are spaced from each other. As shown in FIGS. 2 and 3, the number of the multiple first photoelectric chips 13 is ten in total, and five first photoelectric chips 13 of the ten first photoelectric chips arranged in the first color temperature region 130L are sequentially connected in series, and the other five first photoelectric chips 13 of the ten first photoelectric chips arranged in the first color temperature region 130R are sequentially connected in series. The ten first photoelectric chips 13 are electrically connected between the first electrode 112 and the second electrode 114 to form a first photoelectric chip string, and the first photoelectric chips includes the ten first photoelectric chips 13 connected in series. Furthermore, the two inwardly concave strip-shaped patterns are respectively two arc-shaped patterns. The five first photoelectric chips 13 arranged in the first color temperature region 130L are sequentially arranged starting from opposite ends of the first color temperature region 130L toward a middle of the first color temperature region 130L in a manner of gradually approaching a center (e.g., a geometric center Gc) of the chip mounting region 110, and the opposite ends of the first color temperature region 130L are individually adjacent to a boundary of the chip mounting region 110. Similarly, the five first photoelectric chips 13 arranged in the first color temperature region 130R are sequentially arranged starting from opposite ends of the first color temperature region 130R toward a middle of the first color temperature region 130R in a manner of gradually approaching the center (e.g., the geometric center Gc) of the chip mounting region 110, and the opposite ends of the first color temperature region 130R are individually adjacent to the boundary of the chip mounting region 110.

The multiple second photoelectric chips 15 are arranged in the chip mounting region 110 to form three second color temperature regions 150L, 150M and 150R. Specifically, the three second color temperature regions 150L, 150M and 150R are separated by the two first color temperature regions 130L and 130R in the chip mounting region 110, so that the two first color temperature regions 130L and 130R and the three second color temperature regions 150L, 150M and 150R are alternately arranged in a horizontal radial direction (i.e., from left to right) of the chip mounting region 110. Furthermore, a light-emitting color temperature (also referred to as color temperature of output light) of each of the three second color temperature regions 150L, 150M and 150R is higher than that of each of the two first color temperature regions 130L and 130R. For example, the light-emitting color temperature of each of the first color temperature regions 130L and 130R is a low color temperature such as 1800 Kelvins (K), and the light-emitting color temperature of each of the second color temperature regions 150L, 150M and 150R is a high color temperature such as 2700 K or 3000 K, which is not limited thereto in the embodiment of the disclosure. As shown in FIGS. 2 and 3, the number of the multiple second photoelectric chips 15 is thirty-five in total, and the thirty-five second photoelectric chips 15 are electrically connected between the first electrode 112 and the second electrode 114 to form three second photoelectric chip strings, where one of the three second photoelectric chip strings includes eleven second photoelectric chips 15, and the other two of the three second photoelectric chip strings each contain twelve second photoelectric chips 15. Typically, the number of the second photoelectric chips 15 of each second photoelectric chip string is greater than the number of the first photoelectric chips 13 of each first photoelectric chip string. In addition, the three second color temperature regions 150L, 150M and 150R include the region 150M located between the two first color temperature regions 130L and 130R, the region 150L located at a side (i.e., a left side as shown in FIG. 2) of the first color temperature region 130L facing away from the geometric center Gc, and the region 150R located at a side (i.e., the right side as shown in FIG. 2) of the first color temperature region 130R facing away from the geometric center Gc.

Further, it can be seen from FIGS. 2 and 3 that the package substrate 11 of the chip-on-board type photoelectric device 10 of the embodiment is also provided with resistors R11, R12, R21 and R22. Specifically, the resistors R11 and R12 are connected in parallel, and connected in series to the first photoelectric chip string including ten first photoelectric chips 13 between the first electrode 112 and the second electrode 114, and the resistors R21 and R22 are connected in parallel, and connected in series to the second photoelectric chip string including eleven second photoelectric chips 15 between the first electrode 112 and the second electrode 114. In addition, it can be seen from FIGS. 2 and 3 that five second photoelectric chips 15 of the second photoelectric chip string including eleven second photoelectric chips 15 are arranged in the second color temperature region 150L and the other six second photoelectric chips 15 of the second photoelectric chip strings are arranged in the second color temperature region 150R, and the twelve second photoelectric chips 15 of each of the other two second photoelectric chip strings are arranged in the second color temperature region 150M.

In addition, the two first color temperature regions 130L and 130R and the three second color temperature regions 150L, 150M and 150R are respectively coated with phosphor glues which emit lights with different colors after being excited, for example, the two first color temperature regions 130L and 130R are coated with a phosphor glue which emits a red or orange-red light after being excited (for example, a mixture of a red or orange-red phosphor powder and a silica gel, or a mixture of a KSF red phosphor whose material itself is yellow but an emitting light thereof after being excited is red and a silica gel), the three second color temperature regions 150L, 150M and 150R are coated with a phosphor glue which emits a yellow light after being excited (for example, a mixture of a yellow phosphor and a silica gel), therefore, a light-emitting color temperature of each of the two first color temperature regions 130L and 130R is different from that of each of the three second color temperature regions 150L, 150M and 150R. It should be noted that different phosphor glues coated on the two first color temperature regions 130L and 130R and the three second color temperature regions 150L, 150M and 150R can also use the same multiple (for example, two) phosphors but with different proportions to thereby achieve emission of lights with different colors after being excited. In addition, since the first photoelectric chips 13 and the second photoelectric chips 15 have different resistance I-V characteristic curves, a threshold value of an on-voltage of each of the first photoelectric chips 13 and the second photoelectric chips 15 is about 2.2 volts (V), when a current with a small value is inputted into each of the first photoelectric chips 13 and the second photoelectric chips 15, the first photoelectric chip string will be lighted preferentially because the on-voltage of the first photoelectric chip string is lower than that of each of the second photoelectric chip strings. As the current gradually increases, voltages at both ends of the resistors R11 and R12 of a branch where the first photoelectric chip string is arranged increase, and the current will be shunted to a branch where each of the second photoelectric chip strings is located, so that the second photoelectric chip strings are lighted and the color temperature in each of the first color temperature regions starts to change and becomes the color temperature of each of the second color temperature regions 150L, 150M and 150R.

Figure 1:
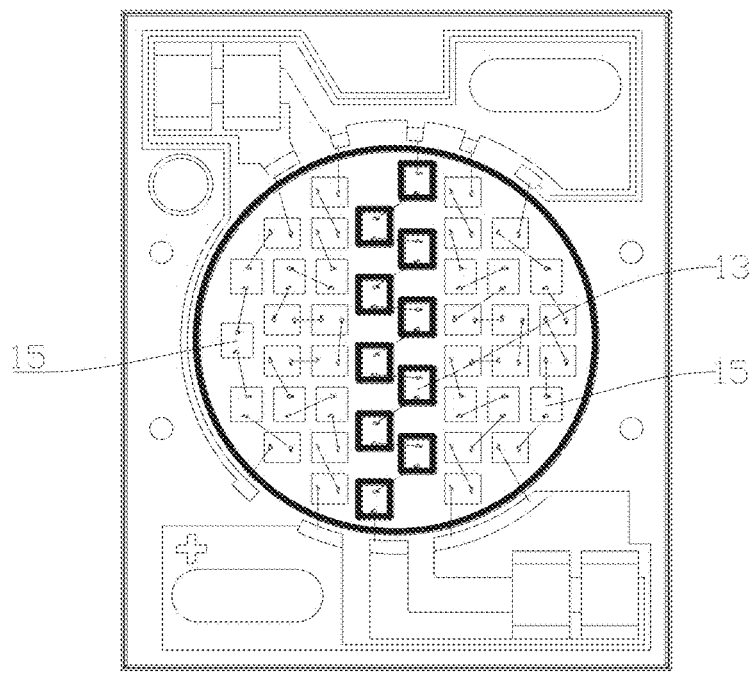
FIG. 1 is a schematic structural diagram of a DW dimming product in the related art.
Figure 4A:
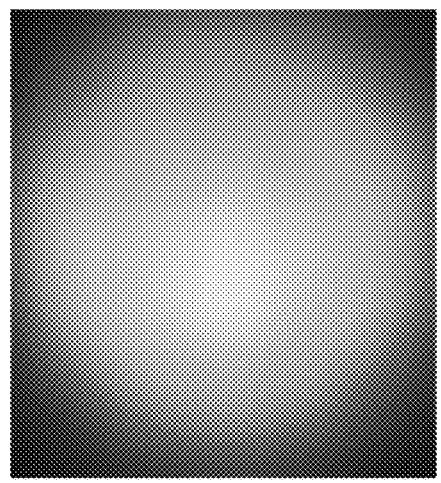
FIGS. 4A and 4B are light-emitting effect diagrams of the DW dimming product shown in FIG. 1 and the chip-on-board type photoelectric device shown in FIG. 2, respectively.
Figure 4B:
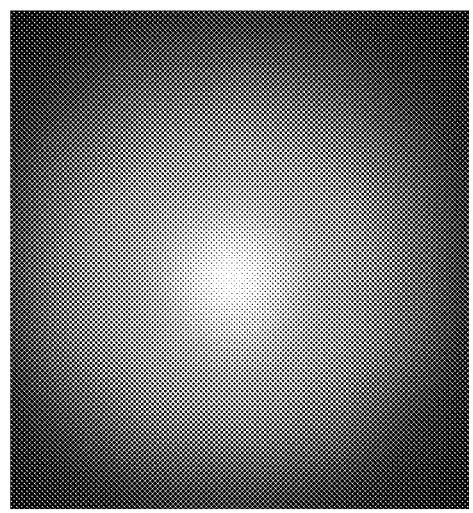

References are made to FIGS. 4A and 4B, which are light-emitting effect diagrams of a DW dimming product shown in FIG. 1 and the chip-on-board type photoelectric device 10 shown in FIG. 2, respectively. Comparing FIG. 4A with FIG. 4B, it can be seen that a light color mixing uniformity of the chip-on-board type photoelectric device 10 of the embodiment is better, that is, the light color mixing uniformity is improved.

Figure 5:
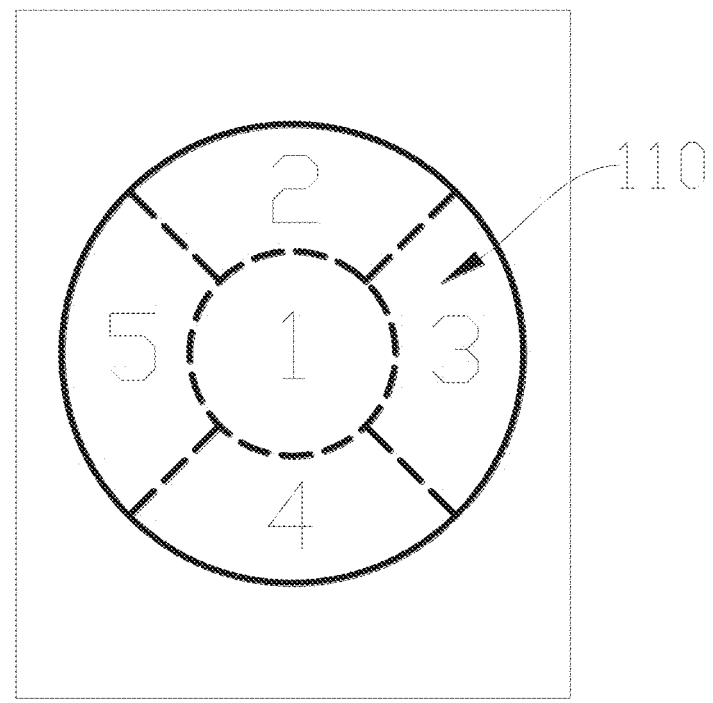
FIG. 5 is a schematic diagram of an evaluation model for a light-emitting area distribution associated with first photoelectric chips according to the first embodiment of the disclosure.

In the embodiment, a basic design idea of improving light color mixing uniformity is to make the first photoelectric chips 13 corresponding to a low color temperature distribute evenly as much as possible. In order to further quantitatively evaluate the design, the embodiment of the disclosure proposes an evaluation model, as shown in FIG. 5, the chip mounting region 110 is divided into multiple imaginary blocks such as five imaginary blocks in an equal area distribution region manner, to analyze a distribution of the first photoelectric chips 13 of the chip-on-board type photoelectric device 10. For example, whether a ratio of a light emitting area of the first photoelectric chips 13 to a total light emitting area of the first photoelectric chips 13 in each imaginary block is consistent is analyzed. The more consistent the ratio of each imaginary block is, the better the light color mixing uniformity of the chip-on-board type photoelectric device 10 is. The light emitting area of each of the first photoelectric chip 13 may be a product of a length and a width of the first photoelectric chip 13.

In FIG. 5, the five imaginary blocks include a central block 1 and quartered blocks 2-5 of an annular region enclosed by a boundary of the central block and a boundary of the chip mounting region 110, where the annular region is divided into the four quartered blocks 2-5 by four axial dividing lines intersecting with both horizontal and vertical directions (i.e., neither parallel to the horizontal direction nor the vertical direction). The center block 1 is circular and its diameter is $\sqrt{5}/5$ times the diameter of the chip mounting region 110 (or referred to as a light emitting surface).

Figure 6A:
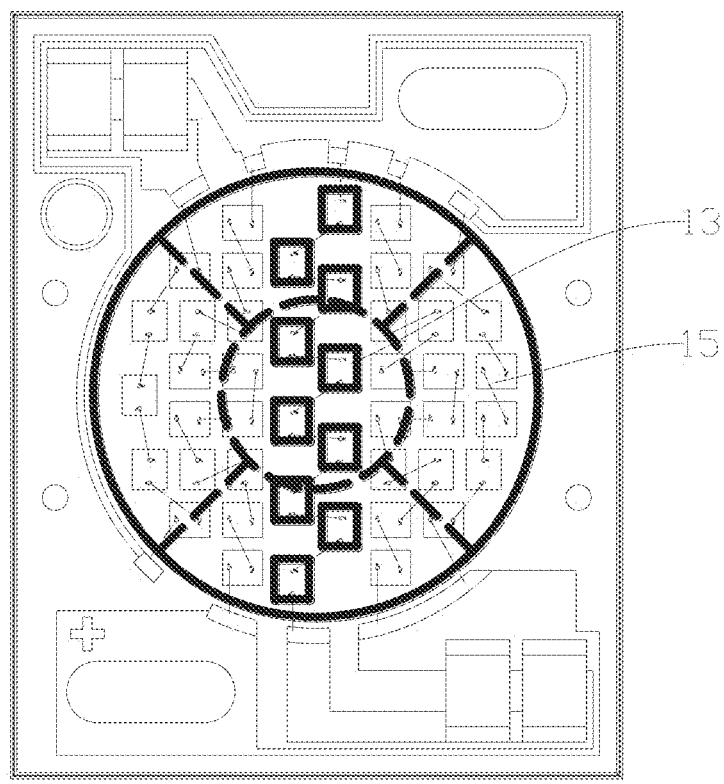
FIGS. 6A and 6B are schematic diagrams of the light-emitting area distributions of the first photoelectric chips when the evaluation model shown in FIG. 5 is applied to the DW dimming product shown in FIG. 1 and the chip-on-board type photoelectric device shown in FIG. 2.
Figure 6B:
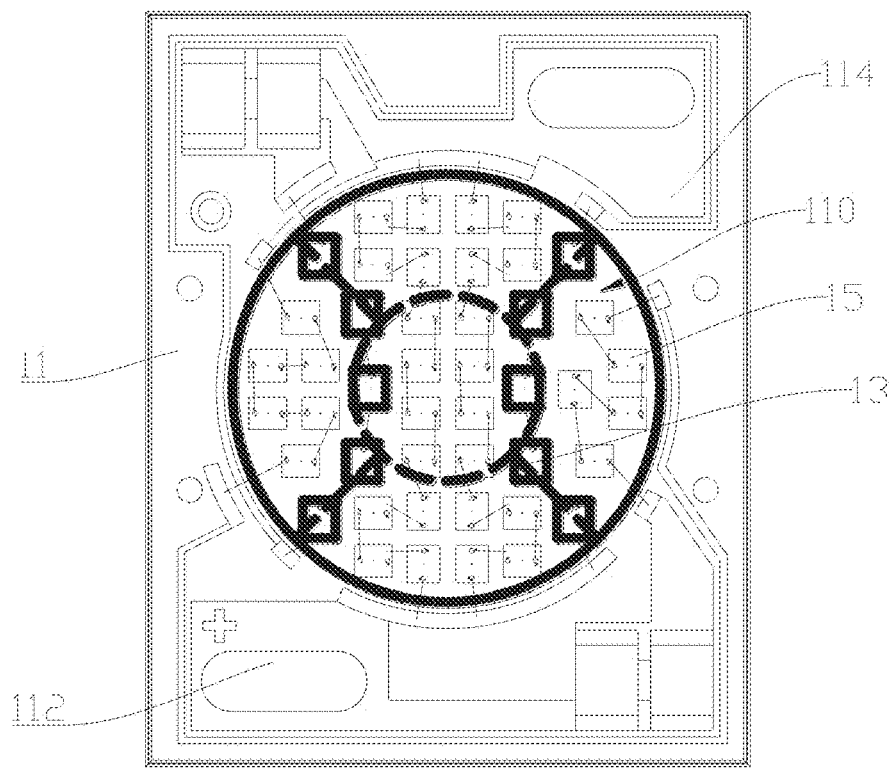

References to FIG. 6A and FIG. 6B, which are schematic diagrams of the light-emitting area distribution of the first photoelectric chips 13 after the evaluation model shown in FIG. 5 is applied to the DW dimming product shown in FIG. 1 and the chip-on-board type photoelectric device shown in FIG. 2, respectively. In FIG. 6A, four of the ten first photoelectric chips 13 are concentrated in the central block 1, three first photoelectric chips 13 are distributed in each of the quartered blocks 2 and 4, and there is no first photoelectric chip 13 arranged in the other two quartered blocks 3 and 5. In contrast, as shown in FIG. 6B, the central region 1 and the four quartered blocks 2-5 each substantially contain the light emitting area of two first photoelectric chips 13, that is, the light emitting area of the first photoelectric chips 13 arranged in each of the central region 1 and the four quartered blocks 2-5 account for approximately 20% of a total light emitting area of the ten first photoelectric chips 13, so that the ratio of the light emitting area of the first photoelectric chips 13 in the five imaginary blocks 1-5 is equal substantially, which indicating that the arrangement of the first photoelectric chips 13 in the chip-on-board type photoelectric device 10 is optimized. In addition, it should be noted that, based on an experiment done by the inventor, it is proved that a good color mixing uniformity can be obtained since the ratio of the light-emitting area of the first photoelectric chips 13 of each of the five imaginary blocks 1-5 is in a range of 15%-25%.

In summary, for the chip-on-board type photoelectric device 10 of the embodiment, multiple first photoelectric chips 13 are reasonably laid out in the chip mounting region 10 to form multiple inwardly concave strip-shaped patterns as multiple first color temperature regions (such as low color temperature regions), and the inwardly concave strip-shaped pattern of each of the first color temperature regions 130L and 130R is axisymmetric or nearly axisymmetric, and a symmetry axis thereof points toward a center of the light emitting surface. As such, a concave shape of each of the first color temperature regions 130L and 130R can ensure that a certain number of first photoelectric chips 13 extend to a central region of the light emitting surface (a central region of the chip mounting region 110), which makes light colors of the light emitting spots of the chip-on-board type photoelectric device 10 in a central circular area and in a concentric axial direction can tend to be uniform. Furthermore, since the opposite ends of each of the first color temperature regions 130L and 130R are adjacent to the boundary of the chip mounting region 110, it is convenient for the first photoelectric chips 13 to form electrical connection (e.g., wire bonding) with the first electrode 112 and the second electrode 114.

Second Embodiment

Figure 7:
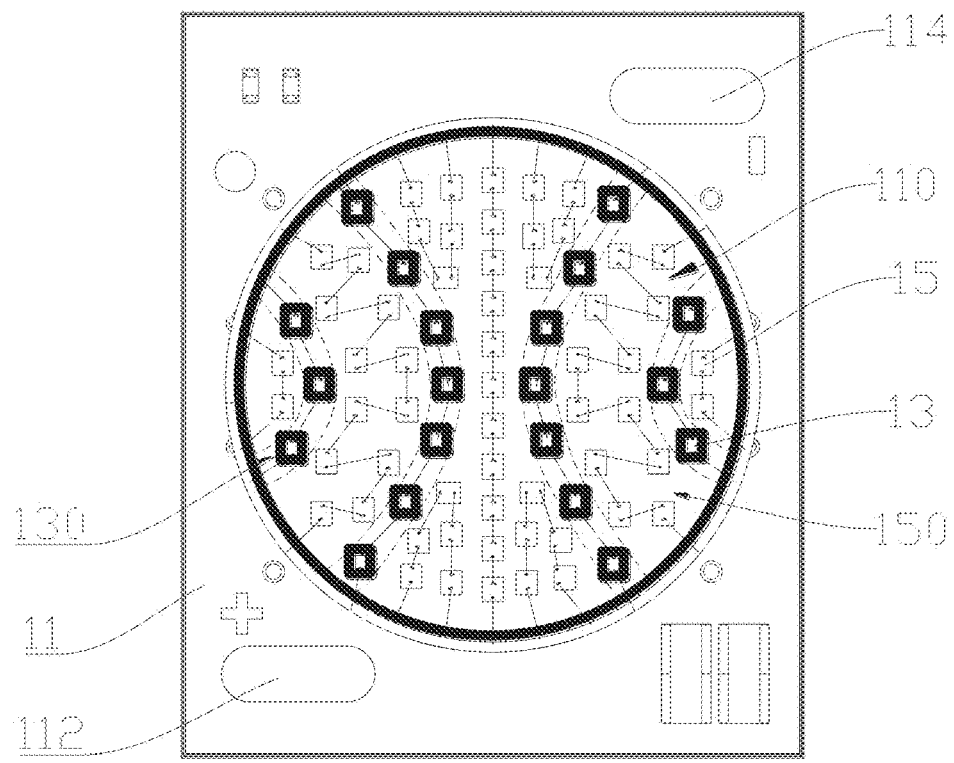
FIG. 7 is a schematic structural diagram of a chip-on-board type photoelectric device according to a second embodiment of the disclosure.

Referring to FIG. 7, a chip-on-board type photoelectric device 30 is provided according to a second embodiment of the disclosure. The chip-on-board type photoelectric device 30 for example includes a package substrate 11, multiple first photoelectric chips 13 and multiple second photoelectric chips 15.

Specifically, the package substrate 11 is provided with a chip mounting region 110, a first electrode 112 and a second electrode 114. The first electrode 112 and the second electrode 114 are separated and arranged at a periphery of the chip mounting region 110. For example, the package substrate 11 may be a mirror aluminum substrate, the chip mounting region 110 may be a circular region surrounded by a dam glue (e.g., the KER2020 opalescent silica gel sold on the market), and the first electrode 112 and the second electrode 114 may be respectively a positive electrode and a negative electrode, which are not limited thereto in the embodiment of the disclosure.

The multiple first photoelectric chips 13 are arranged in the chip mounting region 110 to form four inwardly concave strip-shaped patterns as four first color temperature regions 130. The four inwardly concave strip-shaped patterns are spaced from each other. As shown in FIG. 7, the number of the multiple first photoelectric chips 13 is twenty in total, and the four first color temperature regions 130 arranged separated from left to right sequentially include three first photoelectric chips 13, seven first photoelectric chips 13, seven first photoelectric chips 13 and three first photoelectric chips 13, and the first photoelectric chips 13 in each first color temperature region 130 are sequentially connected in series. Furthermore, the twenty first photoelectric chips 13 are electrically connected between the first electrode 112 and the second electrode 114 to form two first photoelectric chip strings, and each of the two first photoelectric chip strings includes ten first photoelectric chips 13 connected in series. For example, the ten first photoelectric chips 13 arranged in two first color temperature regions 130 on the left constitute one first photoelectric chip string, and the ten first photoelectric chips 13 arranged in two first color temperature regions 130 on the right constitute the other first photoelectric chip string. Furthermore, the four inwardly concave strip-shaped patterns are four arc-shaped patterns respectively, the first photoelectric chips 13 arranged in each first color temperature region 130 are sequentially arranged starting from opposite ends of the first color temperature region 130 toward a middle of the first color temperature region 130 in a manner of gradually approaching a center of the chip mounting region 110, and the opposite ends of the first color temperature region 130 are individually adjacent to a boundary of the chip mounting region 110.

The multiple second photoelectric chips 15 are arranged in the chip mounting region 110 to form five second color temperature regions 150. Specifically, the five second color temperature regions 150 are separated by the four first color temperature regions 130 in the chip mounting region 110, so that the four first color temperature regions 130 and the five second color temperature regions 150 are alternately arranged in a horizontal radial direction of the chip mounting region 110. Furthermore, a light-emitting color temperature of each of the five second color temperature regions is higher than that of each of the four first color temperature regions 130. For example, the light-emitting color temperature of each of the first color temperature regions 130 is a low color temperature such as 1800 K, and the light-emitting color temperature of each of the second color temperature regions 150 is a high color temperature such as 2700 K or 3000 K, which is not limited thereto in the embodiment of the disclosure. As shown in FIG. 7, the number of the multiple second photoelectric chips 15 is fifty-nine in total, and the fifty-nine second photoelectric chips 15 are electrically connected between the first electrode 112 and the second electrode 114 to form five second photoelectric chip strings, where thirty-one second photoelectric chips 15 arranged in the middle second color temperature region 150 and four second photoelectric chips 15 arranged in the leftmost and rightmost second color temperature regions 150 constitute three second photoelectric chip strings (having eleven, twelve and twelve second photoelectric chips 15 respectively), and twelve second photoelectric chips 15 of each of the other two second color temperature regions 150 constitute two second photoelectric chip strings. Typically, the number of the second photoelectric chips 15 of each second photoelectric chip string is greater than the number of the first photoelectric chips 13 of each first photoelectric chip string. In addition, the five second color temperature regions 150 include three regions located between the four first color temperature regions 130, one region located at a side of the leftmost first color temperature region 130 facing away from a center of the chip mounting region 110, and one region located at a side of the rightmost first color temperature region 130 facing away from the center of the chip mounting region 110.

In addition, it should be noted that a number ratio of the first photoelectric chip strings to the second photoelectric chip strings in the embodiment is 2:5, which is different from 1:3 described in the first embodiment. Furthermore, similar to the aforementioned first embodiment, the inwardly concave strip-shaped pattern of each first color temperature region 130 in this embodiment is also an axisymmetric pattern or an approximately axisymmetric pattern, and a symmetry axis thereof points toward a center of the light emitting surface (for example, a geometric center of the chip mounting region 110).

Figure 8:
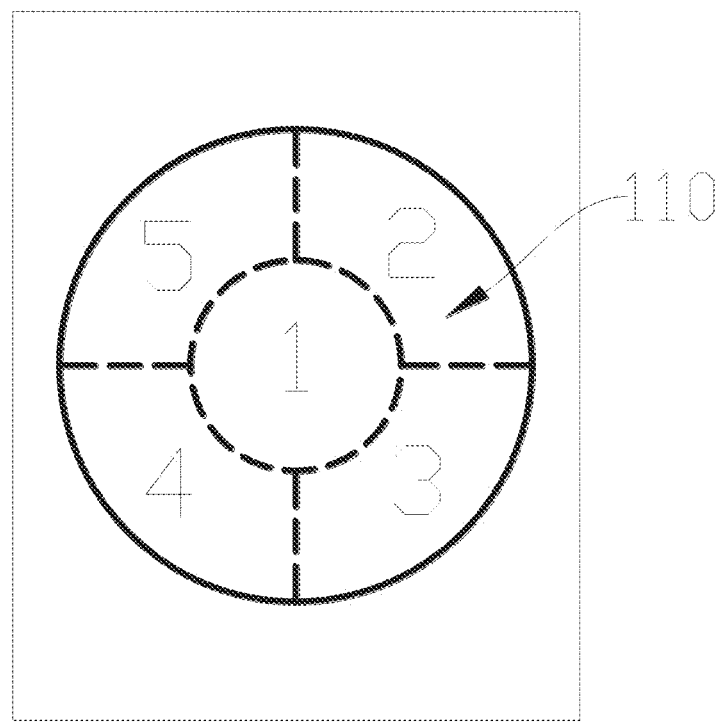
FIG. 8 is a schematic diagram of an evaluation model for a light-emitting area distribution associated with first photoelectric chips according to the second embodiment of the disclosure.
Figure 9:
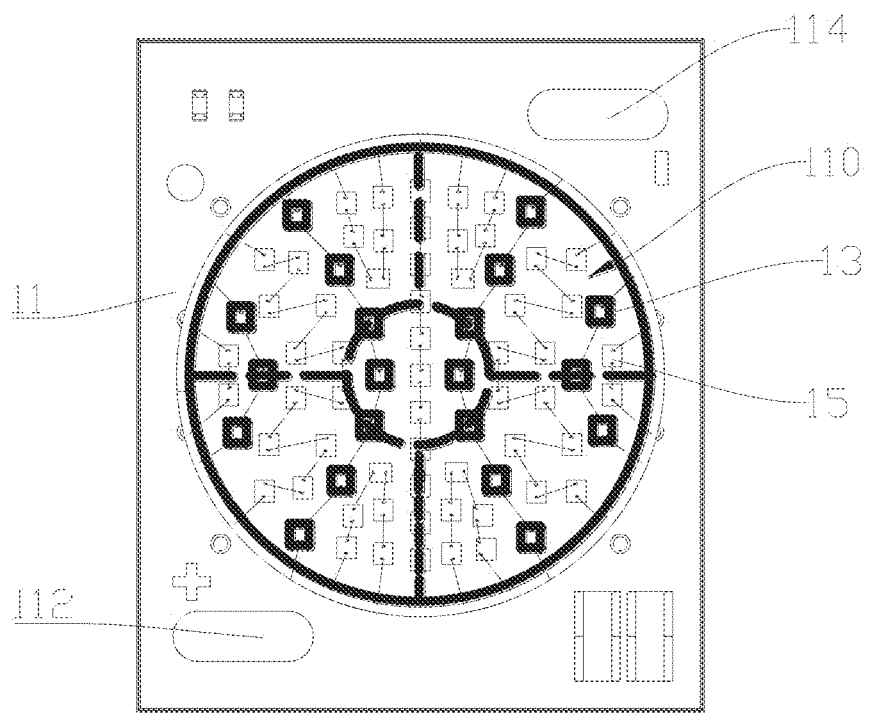
FIG. 9 is a schematic diagram of a light-emitting area distribution of first photoelectric chips after applying the evaluation model shown in FIG. 8 to the chip-on-board type photoelectric device shown in FIG. 7.

Referring to FIGS. 8 and 9, FIG. 8 provides another evaluation model including five imaginary blocks, and FIG. 9 is a schematic diagram of a light-emitting area distribution of the first photoelectric chips 13 after the evaluation model shown in FIG. 8 is applied to the chip-on-board type photoelectric device 30 shown in FIG. 7. In FIG. 8, the five imaginary blocks include a central block 1 and quartered blocks 2-5 of an annular region enclosed by a boundary of the central block and a boundary of the chip mounting region 110, where the annular region is divided into the four quartered blocks 2-5 by four axial dividing lines intersecting with both horizontal and vertical directions. The center block 1 is circular and its diameter is $\sqrt{5}/5$ times the diameter of the chip mounting region 110 (or referred to as a light emitting surface).

It can be seen from FIGS. 8 and 9 that the central region 1 and the four quartered blocks 2-5 each include the light-emitting area of four first photoelectric chips 13, that is, the light emitting area of the first photoelectric chips 13 arranged in each of the central region 1 and the four quartered blocks 2-5 account for approximately 20% of a total light emitting area of the twenty first photoelectric chips 13, so that the ratio of the light emitting area of the first photoelectric chips 13 in the five imaginary blocks 1-5 is equal substantially, which indicating that the arrangement of the first photoelectric chips 13 in the chip-on-board type photoelectric device 30 is optimized. In addition, it should be noted that, based on an experiment done by the inventor, it is proved that a good color mixing uniformity can be obtained since the ratio of the light-emitting area of the first photoelectric chips 13 of each of the five imaginary blocks 1-5 is in a range of 15%-25%. Further, it should be noted that, if the evaluation model shown in FIG. 5 is adopted, the light-emitting area of the first photoelectric chips 13 arranged in the central area 1 and the four quadrants 2-5 are equal substantially, that is, each of the central area 1 and the four quadrants 2-5 includes the light-emitting area of the four first photoelectric chips 13.

Third Embodiment

Figure 10:
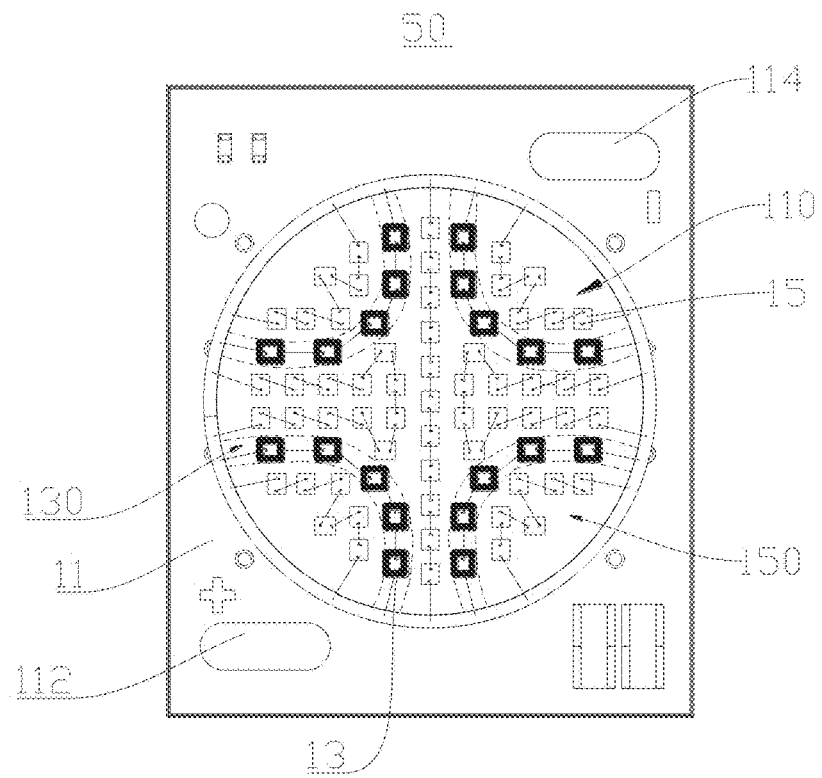
FIG. 10 is a schematic structural diagram of a chip-on-board type photoelectric device according to a third embodiment of the disclosure.

Referring to FIG. 10, a chip-on-board type photoelectric device 50 is provided according to a third embodiment of the disclosure. The chip-on-board type photoelectric device 50 for example includes a package substrate 11, multiple first photoelectric chips 13 and multiple second photoelectric chips 15.

Specifically, the package substrate 11 is provided with a chip mounting region 110, a first electrode 112 and a second electrode 114. The first electrode 112 and the second electrode 114 are separated and arranged at a periphery of the chip mounting region 110. For example, the package substrate 11 may be a mirror aluminum substrate, the chip mounting region 110 may be a circular region surrounded by a dam glue (e.g., the KER2020 opalescent silica gel sold on the market), and the first electrode 112 and the second electrode 114 may be respectively a positive electrode and a negative electrode, which are not limited thereto in the embodiment of the disclosure.

The multiple first photoelectric chips 13 are arranged in the chip mounting region 110 to form four inwardly concave strip-shaped patterns as four first color temperature regions 130. The four inwardly concave strip-shaped patterns are spaced from each other. As shown in FIG. 10, the four first color temperature regions 130 are located at four corners of the chip mounting region 110, the number of the multiple first photoelectric chips 13 is twenty in total, each first color temperature region 130 includes five first photoelectric chips 13, and the five first photoelectric chips 13 in each first color temperature region 130 are sequentially connected in series. Furthermore, the twenty first photoelectric chips 13 are electrically connected between the first electrode 112 and the second electrode 114 to form two first photoelectric chip strings, and each of the two first photoelectric chip strings includes ten first photoelectric chips 13 connected in series.

For example, the ten first photoelectric chips 13 arranged in leftmost two first color temperature regions 130 constitute one first photoelectric chip string, and the ten first photoelectric chips 13 arranged in rightmost two first color temperature regions 130 constitute the other first photoelectric chips. Furthermore, the four inwardly concave strip-shaped patterns are four arc-shaped patterns respectively, the first photoelectric chips 13 arranged in each first color temperature region 130 are sequentially arranged starting from opposite ends of the first color temperature region 130 toward a middle of the first color temperature region 130 in a manner of gradually approaching a center of the chip mounting region 110, and the opposite ends of the first color temperature region 130 are individually adjacent to a boundary of the chip mounting region 110.

The multiple second photoelectric chips 15 are arranged in the chip mounting region 110 to form five second color temperature regions 150. Specifically, the five second color temperature regions 150 are separated by the four first color temperature regions 130 in the chip mounting region 110, or one second color temperature region 150 is arranged between two adjacent first color temperature regions 130. Furthermore, a light-emitting color temperature of each of the five second color temperature regions is higher than that of each of the four first color temperature regions 130. For example, the light-emitting color temperature of each of the first color temperature regions 130 is a low color temperature such as 1800 K, and the light-emitting color temperature of each of the second color temperature regions 150 is a high color temperature such as 2700 K or 3000 K, which is not limited thereto in the embodiment of the disclosure. As shown in FIG. 10, the number of the multiple second photoelectric chips 15 is fifty-nine in total, and the fifty-nine second photoelectric chips 15 are electrically connected between the first electrode 112 and the second electrode 114 to form five second photoelectric chip strings, where thirty-five second photoelectric chips 15 arranged in the middle second color temperature region 150 constitute three second photoelectric chip strings (having twelve, eleven and twelve second photoelectric chips 15 respectively), twelve second photoelectric chips 15 arranged in two second color temperature regions 150 outside the left two first color temperature regions 130 constitute one second photoelectric chip string, and twelve second photoelectric chips 15 arranged in two second color temperature regions 150 outside the right two first color temperature regions 130 constitute one second photoelectric chip string. Typically, the number of the second photoelectric chips 15 of each second photoelectric chip string is greater than the number of the first photoelectric chips 13 of each first photoelectric chip string. In addition, the five second color temperature regions 150 include one region located between the four first color temperature regions 130, and four regions located at a side of each of the four first color temperature regions 130 facing away from a center of the chip mounting region 110.

In addition, it should be noted that a number ratio of the first photoelectric chip strings to the second photoelectric chip strings in the embodiment is 2:5, which is different from 1:3 described in the first embodiment. Furthermore, similar to the aforementioned first embodiment, the inwardly concave strip-shaped pattern of each first color temperature region 130 in this embodiment is also an axisymmetric pattern or an approximately axisymmetric pattern, and a symmetry axis thereof points toward a center of the light emitting surface (for example, a geometric center of the chip mounting region 110).

Fourth Embodiment

Figure 11:
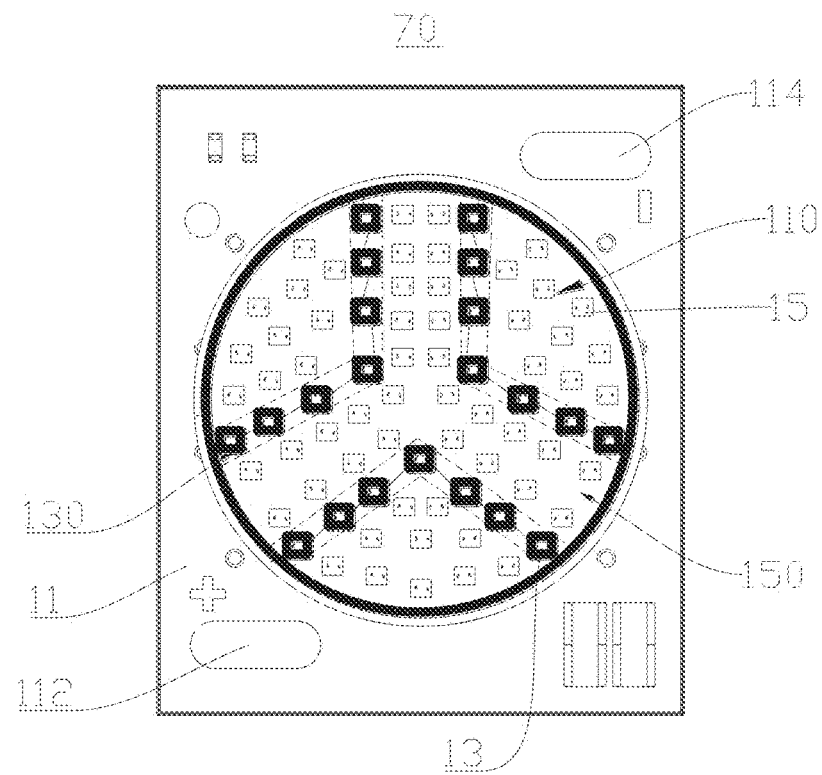
FIG. 11 is a schematic structural diagram of a chip-on-board type photoelectric device according to a fourth embodiment of the disclosure.

Referring to FIG. 11, a chip-on-board type photoelectric device 70 is provided according to a third embodiment of the disclosure. The chip-on-board type photoelectric device 70 for example includes a package substrate 11, multiple first photoelectric chips 13 and multiple second photoelectric chips 15.

Specifically, the package substrate 11 is provided with a chip mounting region 110, a first electrode 112 and a second electrode 114. The first electrode 112 and the second electrode 114 are separated and arranged at a periphery of the chip mounting region 110. For example, the package substrate 11 may be a mirror aluminum substrate, the chip mounting region 110 may be a circular region surrounded by a dam glue (e.g., the KER2020 opalescent silica gel sold on the market), and the first electrode 112 and the second electrode 114 may be respectively a positive electrode and a negative electrode, which are not limited thereto in the embodiment of the disclosure.

The multiple first photoelectric chips 13 are arranged in the chip mounting region 110 to form third inwardly concave strip-shaped patterns as third first color temperature regions 130. The third inwardly concave strip-shaped patterns are spaced from each other. As shown in FIG. 11, the number of the multiple first photoelectric chips 13 is twenty-one in total, each first color temperature region 130 includes seven first photoelectric chips 13, and the seven first photoelectric chips 13 in each first color temperature region 130 are sequentially connected in series. Furthermore, the twenty-one first photoelectric chips 13 are electrically connected between the first electrode 112 and the second electrode 114 to form three first photoelectric chip strings, and each of the three first photoelectric chip strings includes seven first photoelectric chips 13 connected in series. Furthermore, the three inwardly concave strip-shaped patterns are three fold-line patterns respectively, the first photoelectric chips 13 arranged in each first color temperature region 130 are sequentially arranged starting from opposite ends of the first color temperature region 130 toward a middle of the first color temperature region 130 in a manner of gradually approaching a center of the chip mounting region 110, and the opposite ends of the first color temperature region 130 are individually adjacent to a boundary of the chip mounting region 110.

The multiple second photoelectric chips 15 are arranged in the chip mounting region 110 to form four second color temperature regions 150. Specifically, the four second color temperature regions 150 are separated by the three first color temperature regions 130 in the chip mounting region 110, or one second color temperature region 150 is arranged between two adjacent first color temperature regions 130. Furthermore, a light-emitting color temperature of each of the four second color temperature regions is higher than that of each of the three first color temperature regions 130. For example, the light-emitting color temperature of each of the first color temperature regions 130 is a low color temperature such as 1800 K, and the light-emitting color temperature of each of the second color temperature regions 150 is a high color temperature such as 2700 K or 3000 K, which is not limited thereto in the embodiment of the disclosure. As shown in FIG. 11, the number of the multiple second photoelectric chips 15 is fifty-eight in total, and the fifty-eight second photoelectric chips 15 are electrically connected between the first electrode 112 and the second electrode 114 to form six second photoelectric chip strings, where twenty-eight second photoelectric chips 15 arranged in the middle second color temperature region 150 constitute three second photoelectric chip strings (having ten, eight and ten second photoelectric chips 15 respectively), and each ten second photoelectric chips 15 arranged in the other three second color temperature regions 150 constitute the other three second photoelectric chip strings. Typically, the number of the second photoelectric chips 15 of each second photoelectric chip string is greater than the number of the first photoelectric chips 13 of each first photoelectric chip string. In addition, the four second color temperature regions 150 include one region located between the three first color temperature regions 130, and three regions located at a side of each of the three first color temperature regions 130 facing away from a center of the chip mounting region 110.

In addition, it should be noted that a number ratio of the first photoelectric chip strings to the second photoelectric chip strings in the embodiment is 3:6, which is different from 1:3 described in the first embodiment. Furthermore, unlike the arc-shaped patterns described in the first embodiment, the inwardly concave strip-shaped pattern of each first color temperature region 130 in this embodiment is a fold-line pattern. Furthermore, the fold-line pattern is also an axisymmetric pattern or an approximately axisymmetric pattern, and a symmetry axis thereof points toward a center of the light emitting surface (for example, a geometric center of the chip mounting region 110).

It should be noted that the first photoelectric chips 13 and the second photoelectric chips 15 in various embodiments of the disclosure can be lateral LED chips of the same color having advantages of high optical efficiency and low cost, such as blue lateral LED chips, which is not limited thereto in the disclosure. In addition, a number ratio of the one or more first photoelectric chip strings to the second photoelectric chip strings of the chip-on-board type photoelectric device according to various embodiments of the disclosure is not limited to the values listed in the first to fourth embodiments, but can also be other values, and the following conditions are preferably satisfied that the number ratio of the one or more first photoelectric chip strings to the second photoelectric chip strings is in a range of 1:2 to 1:7, and the number of the second photoelectric chip strings is greater than or equal to 3, so as to ensure the overall light-emitting efficiency of the chip-on-board type photoelectric device. In addition, the number of the first photoelectric chips 13 in each first color temperature region 130 (or 130L and 130R) may be the same or different. Each of inwardly concave strip-shaped patterns in the chip mounting regions 110 may have a central symmetry, an axial symmetry or an asymmetric relationship. In addition, the number of the first color temperature regions 130 (or 130L and 130R) in the chip mounting region 110 is not limited to the two, three and four listed in the first to fourth embodiments, and can also be flexibly designed based on a size of the light emitting surface (or a size of the chip mounting region 110) and the number of chips.

In addition, it should be understood that the aforementioned embodiments are only exemplary descriptions of the disclosure, and the technical solutions of the various embodiments can be arbitrarily combined and used in combination on the premise of no conflict in technical features, no contradiction in structure and no violation of the inventive purpose of the disclosure.

Finally, it should be noted that the above embodiments are merely used to illustrate the technical solutions of the disclosure, but not to limit the technical solutions. Although the disclosure has been described in detail with reference to the aforementioned embodiments, those of ordinary skill in the art should understand that the technical solutions described in the aforementioned embodiments can be also modified, or some or all of the technical features of the embodiments can be equivalently substituted, and the spirits of corresponding technical solutions with these modifications or replacements do not deviate from the scope of the technical solutions of the respective embodiments of the disclosure.

What is claimed is:

1. A chip-on-board (COB) type photoelectric device, comprising:
    a package substrate, provided with a chip mounting region, a first electrode and a second electrode, wherein the first electrode and the second electrode are arranged spaced from each other at a periphery of the chip mounting region;
    a plurality of first photoelectric chips, arranged in the chip mounting region to form a plurality of inwardly concave strip-shaped patterns as a plurality of first color temperature regions, wherein the plurality of inwardly concave strip-shaped patterns are spaced from each other, a plurality of the first photoelectric chips arranged in each of the plurality of first color temperature regions are connected in series, the plurality of first photoelectric chips are electrically connected between the first electrode and the second electrode to form at least one first photoelectric chip string, and each of the at least one first photoelectric chip string comprises a plurality of the first photoelectric chips connected in series; and
    a plurality of second photoelectric chips, arranged in the chip mounting region to form a plurality of second color temperature regions, wherein the plurality of second color temperature regions are separated by the plurality of first color temperature regions in the chip mounting region, a light-emitting color temperature of each of the plurality of second color temperature regions is higher than that of each of the plurality of first color temperature regions, the plurality of second photoelectric chips are electrically connected between the first electrode and the second electrode to form a plurality of second photoelectric chip strings, and each of the plurality of second photoelectric chip strings comprises a plurality of the second photoelectric chips connected in series.

2. The chip-on-board type photoelectric device according to claim 1, wherein the plurality of first photoelectric chips arranged in each of the plurality of first color temperature regions are sequentially arranged starting from opposite ends of the first color temperature region and toward a middle of the first color temperature region in a manner of gradually approaching a center of the chip mounting region, and the opposite ends are individually adjacent to a boundary of the chip mounting region; and
    wherein the plurality of second color temperature regions comprise: at least one region located between the plurality of first color temperature regions, and regions each located at a side of each of the plurality of first color temperature regions facing away from the center.

3. The chip-on-board type photoelectric device according to claim 2, wherein each of the plurality of inwardly concave strip-shaped patterns is an arc-shaped pattern.

4. The chip-on-board type photoelectric device according to claim 3, wherein the plurality of first color temperature regions respectively comprise the same number of the first photoelectric chips.

5. The chip-on-board type photoelectric device according to claim 3, wherein the plurality of first color temperature regions respectively comprise different numbers of the first photoelectric chips.

6. The chip-on-board type photoelectric device according to claim 2, wherein each of the plurality of inwardly concave strip-shaped patterns is a fold-line pattern.

7. The chip-on-board typed photoelectric device according to claim 6, wherein the plurality of first color temperature regions respectively comprise the same number of the first photoelectric chips.

8. The chip-on-board type photoelectric device according to claim 6, wherein the plurality of first color temperature regions respectively comprise different numbers of the first photoelectric chips.

9. The chip-on-board type photoelectric device according to claim 1, wherein each of the plurality of inwardly concave strip-shaped patterns is an axisymmetric pattern, and a symmetry axis of the inwardly concave strip-shaped pattern points toward a geometric center of the chip mounting region.

10. The chip-on-board type photoelectric device according to claim 1, wherein a number ratio of the at least one first photoelectric chip string to the plurality of second photoelectric chip strings is in a range of 1:2-1:7, and the number of the plurality of second photoelectric chip strings is greater than or equal to 3.

11. The chip-on-board type photoelectric device according to claim 1, wherein each of the at least one first photoelectric chip string and a resistor arranged on the package substrate are connected in series between the first electrode and the second electrode.

12. The chip-on-board type photoelectric device according to claim 11, wherein the number of the plurality of first photoelectric chips of each of the at least one first photoelectric chip string is smaller than the number of the plurality of second photoelectric chips of each of the plurality of second photoelectric chip strings.

13. The chip-on-board type photoelectric device according to claim 1, wherein within five imaginary blocks of equal areas divided in the chip mounting region, a ratio of a light-emitting area of the first photoelectric chips in each of the five imaginary blocks to a total light-emitting area of the plurality of first photoelectric chips in the chip mounting region is in a range of 15%-25%, and the five imaginary blocks comprise a central block and quartered blocks of an annular region enclosed by a boundary of the central block and a boundary of the chip mounting region.

14. The chip-on-board type photoelectric device according to claim 13, wherein the central block is circular, and a diameter of the central block is $\sqrt{5}/5$ times of a diameter of the chip mounting region.

15. The chip-on-board type photoelectric device according to claim 1, wherein the light-emitting color temperature of each of the plurality of first color temperature regions is 1800 Kelvins (K), and the light-emitting color temperature of each of the plurality of second color temperature regions is 2700 K or 3000 K.

16. The chip-on-board type photoelectric device according to claim 1, wherein the package substrate is a mirror aluminum substrate, the chip mounting region is a circular region surrounded by a dam glue, and the first electrode and the second electrode are respectively a positive electrode and a negative electrode.

17. The chip-on-board type photoelectric device according to claim 1, wherein the plurality of first color temperature regions and the plurality of second color temperature regions are alternately arranged in a horizontal radial direction of the chip mounting region.

18. The chip-on-board type photoelectric device according to claim 1, wherein the plurality of first photoelectric chips and the plurality of second photoelectric chips are lateral light emitting diode (LED) chips.

* * * * *